US010980151B2

(12) United States Patent
Bala et al.

(10) Patent No.: US 10,980,151 B2
(45) Date of Patent: Apr. 13, 2021

(54) FLEXIBLE HEAT TRANSFER MECHANISM CONFIGURATIONS

(71) Applicant: HEWLETT PACKARD ENTERPRISE DEVELOPMENT LP, Houston, TX (US)

(72) Inventors: Sunil Rao Ganta Papa Rao Bala, Houston, TX (US); Richard Bargerhuff, Houston, TX (US); Nabeel Fathi, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/051,337

(22) Filed: Jul. 31, 2018

(65) Prior Publication Data

US 2020/0045850 A1  Feb. 6, 2020

(51) Int. Cl.
*H05K 7/20* (2006.01)
*H01L 23/433* (2006.01)

(52) U.S. Cl.
CPC ....... *H05K 7/20454* (2013.01); *H01L 23/433* (2013.01); *H01L 23/4338* (2013.01); *H05K 7/2049* (2013.01); *H05K 7/20436* (2013.01)

(58) Field of Classification Search
CPC ........... H05K 7/20436; H05K 7/20454; H05K 7/20472; H05K 7/2049; H01L 23/433; H01L 23/4338; H01L 2023/4037; H01L 2023/405; H01L 2023/4056
See application file for complete search history.

(56) References Cited

U.S. PATENT DOCUMENTS

| | | | | | |
|---|---|---|---|---|---|
| 3,212,564 | A | * | 10/1965 | Passman | H01L 23/3672 165/47 |
| 4,153,107 | A | * | 5/1979 | Antonetti | H01L 23/42 165/185 |
| 4,203,129 | A | * | 5/1980 | Oktay | H01L 23/42 165/104.14 |
| 4,246,597 | A | * | 1/1981 | Cole | H01L 23/3675 165/185 |
| 4,448,240 | A | * | 5/1984 | Sharon | H01L 23/4338 165/185 |
| 4,462,462 | A | * | 7/1984 | Meagher | H01L 23/4338 165/80.1 |
| 4,483,389 | A | * | 11/1984 | Balderes | H01L 23/4338 165/80.3 |

(Continued)

FOREIGN PATENT DOCUMENTS

| | | | |
|---|---|---|---|
| DE | 2801660 A1 | 7/1979 | |
| DE | 4004457 A1 * | 8/1991 | ........... H01L 23/433 |
| WO | WO-2012126748 A1 * | 9/2012 | ......... H01L 23/4093 |

OTHER PUBLICATIONS

Advanced Cooling Technologies, "Spot Cooling Heat Pipes," 2018, 8 pages, https://www.1-act.com/spot-cooling-heat-pipes/.

*Primary Examiner* — Robert J Hoffberg
(74) *Attorney, Agent, or Firm* — Hewlett Packard Enterprise Patent Department

(57) ABSTRACT

A flexible heat transfer mechanism is provided for transferring heat from a heat generating component to a heatsink. The heat transfer mechanism may include a pedestal coupled to the heatsink via a heat transfer element. The heat transfer element may be a compliant member that is capable of flexing in a vertical direction such that the pedestal may be vertically displaced relative to the heatsink.

13 Claims, 8 Drawing Sheets

(56) References Cited

U.S. PATENT DOCUMENTS

| | | | | |
|---|---|---|---|---|
| 4,639,829 A * | 1/1987 | Ostergren | H01L 23/4006 | 165/185 |
| 4,783,721 A * | 11/1988 | Yamamoto | G02F 1/0036 | 257/714 |
| 5,005,638 A * | 4/1991 | Goth | H01L 23/4338 | 165/185 |
| 5,247,425 A * | 9/1993 | Takahasi | H01L 23/4338 | 165/185 |
| 5,343,940 A * | 9/1994 | Jean | F28D 15/0241 | 165/104.33 |
| 5,705,850 A * | 1/1998 | Ashiwake | H01L 23/4338 | 257/706 |
| 5,862,038 A * | 1/1999 | Suzuki | H01L 23/4006 | 165/80.2 |
| 5,896,269 A * | 4/1999 | Autry | H01L 23/3672 | 165/185 |
| 5,926,369 A * | 7/1999 | Ingraham | H01L 23/367 | 165/185 |
| 6,259,602 B1 * | 7/2001 | Malhammar | H01L 23/3672 | 165/185 |
| 6,411,513 B1 * | 6/2002 | Bedard | H01L 23/3672 | 165/185 |
| 6,462,952 B1 * | 10/2002 | Ubukata | B21J 5/12 | 361/719 |
| 6,608,752 B2 * | 8/2003 | Morris | H01L 23/34 | 165/104.33 |
| 6,708,754 B2 | 3/2004 | Wei | | |
| 6,982,877 B2 * | 1/2006 | Vinson | G06F 1/20 | 165/185 |
| 7,019,973 B2 * | 3/2006 | Rivera | H01L 23/427 | 165/104.33 |
| 7,096,926 B2 * | 8/2006 | Belady | F28F 23/00 | 165/104.21 |
| 7,277,291 B2 * | 10/2007 | Ross | H01L 23/4338 | 165/104.33 |
| 7,408,780 B2 * | 8/2008 | Karidis | H01L 23/433 | 165/80.2 |
| 7,663,883 B2 * | 2/2010 | Shirakami | H01L 23/373 | 165/46 |
| 7,916,485 B2 * | 3/2011 | Yu | F28F 3/02 | 165/104.26 |
| 8,004,846 B2 * | 8/2011 | Okada | H01L 23/433 | 165/185 |
| 8,270,170 B2 * | 9/2012 | Hughes | H05K 7/20445 | 165/104.33 |
| 8,363,405 B2 * | 1/2013 | Guan | H01L 23/36 | 165/185 |
| 8,567,483 B2 | 10/2013 | Kamath et al. | | |
| 9,366,482 B2 * | 6/2016 | Yang | H01L 23/427 | |
| 10,109,556 B2 * | 10/2018 | Joshi | H01L 23/40 | |
| 2004/0052052 A1 * | 3/2004 | Rivera | H01L 23/427 | 361/700 |
| 2004/0194915 A1 * | 10/2004 | Belady | F28F 23/00 | 165/46 |
| 2006/0087816 A1 * | 4/2006 | Ewes | F28F 3/02 | 361/704 |
| 2006/0215368 A1 * | 9/2006 | Tsai | H01L 23/427 | 361/704 |
| 2007/0146990 A1 * | 6/2007 | Hsieh | G06F 1/20 | 361/690 |
| 2008/0298016 A1 * | 12/2008 | Karidis | H01L 23/433 | 361/698 |
| 2010/0157540 A1 * | 6/2010 | Yu | F28F 3/02 | 361/710 |
| 2010/0246136 A1 * | 9/2010 | Yu | H01L 23/367 | 361/710 |
| 2013/0188317 A1 * | 7/2013 | Ho | F28F 3/022 | 361/710 |
| 2014/0151009 A1 * | 6/2014 | Bahadur | F28F 13/00 | 165/185 |
| 2016/0118315 A1 | 4/2016 | Smith et al. | | |
| 2016/0263714 A1 * | 9/2016 | Yang | H01L 23/427 | |

* cited by examiner

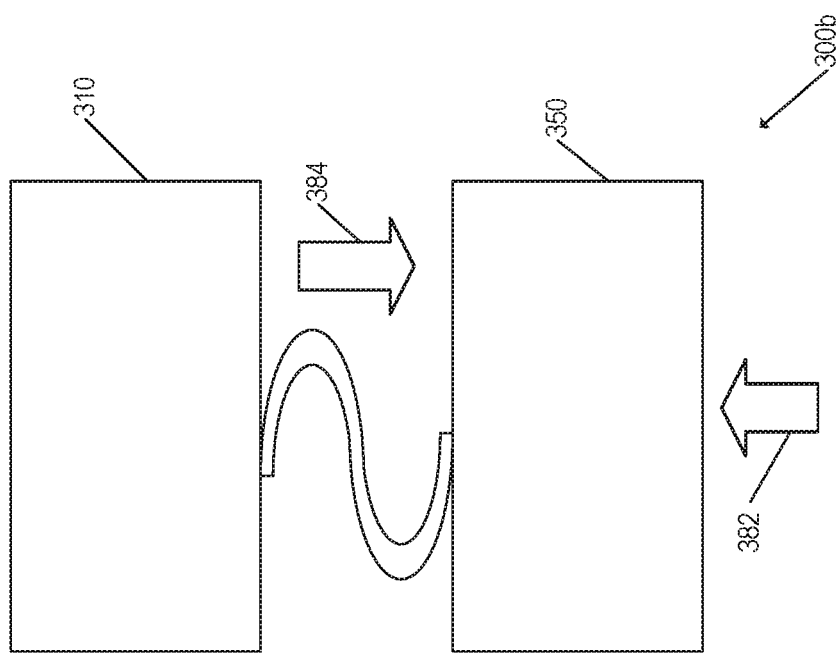
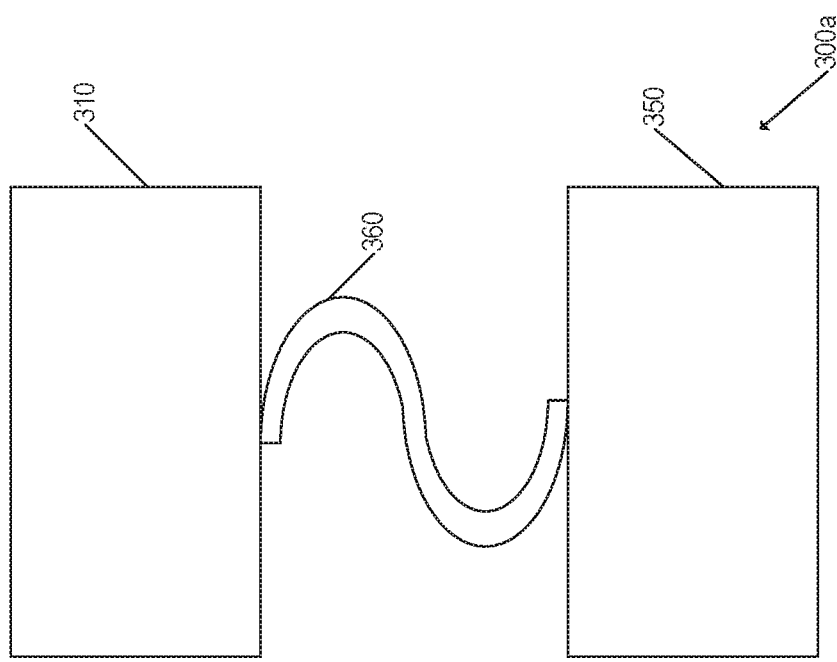

FLEXIBLE HEAT TRANSFER MECHANISM CONFIGURATIONS

BACKGROUND

Heat generating components, e.g., electrical components mechanically fastened and electrically connected to a circuit board, may produce considerable heat as a consequence of their operation. The heat generated by these components, if not properly dissipated, may damage the components themselves, neighboring components, or the printed circuit board on which they are fastened.

To effectively dissipate heat from these heat generating components, heat transfer devices, such as a heatsink, may be utilized. A heatsink may transfer heat from a high temperature device such as a heat generating component described above, to a lower temperature fluid medium such as air or water.

BRIEF DESCRIPTION OF THE DRAWINGS

Certain examples are described in the following detailed description and in reference to the drawings, in which:

FIGS. 3a and 3b are block diagrams illustrating another example flexible heat transfer mechanism.

DETAILED DESCRIPTION OF SPECIFIC EXAMPLES

Heat generating components may rely on heatsinks for cooling. A heatsink may, in some examples, form an outer shell that houses the heat generating components. In such applications, heat generating components and heatsinks may be designed to mate. However, heat generating components may be of variable sizes, which may present challenges for the mating of a heat generating component with the heatsink.

To provide for effective thermal transfer between a heatsink and a heat generating component, a flexible heat transfer mechanism may be provided. The mechanism may include a pedestal to interface with the heat generating component, and to draw heat from the heat generating component via thermal conduction to the area where the heat is to be dissipated, e.g. the heatsink. In some implementations, the pedestal is static, such that the pedestal may not be displaced relative to the heatsink. Where a static pedestal is utilized, a malleable gap pad may be inserted between the pedestal and the heat generating component to accommodate differently sized heat generating components and to account for any changes in size that the heat generating components may undergo.

However, the pedestal may be of greater thermal conductivity than the gap pad. Thus, inclusion of the gap pad between the heat generating component and the pedestal may draw heat from the heat generating component less effectively than would a direct connection between the pedestal and the heat generating component. Gap pads of varying sizes may be required to properly accommodate the mating of variably sized heat generating components with corresponding pedestals.

Figure 1:
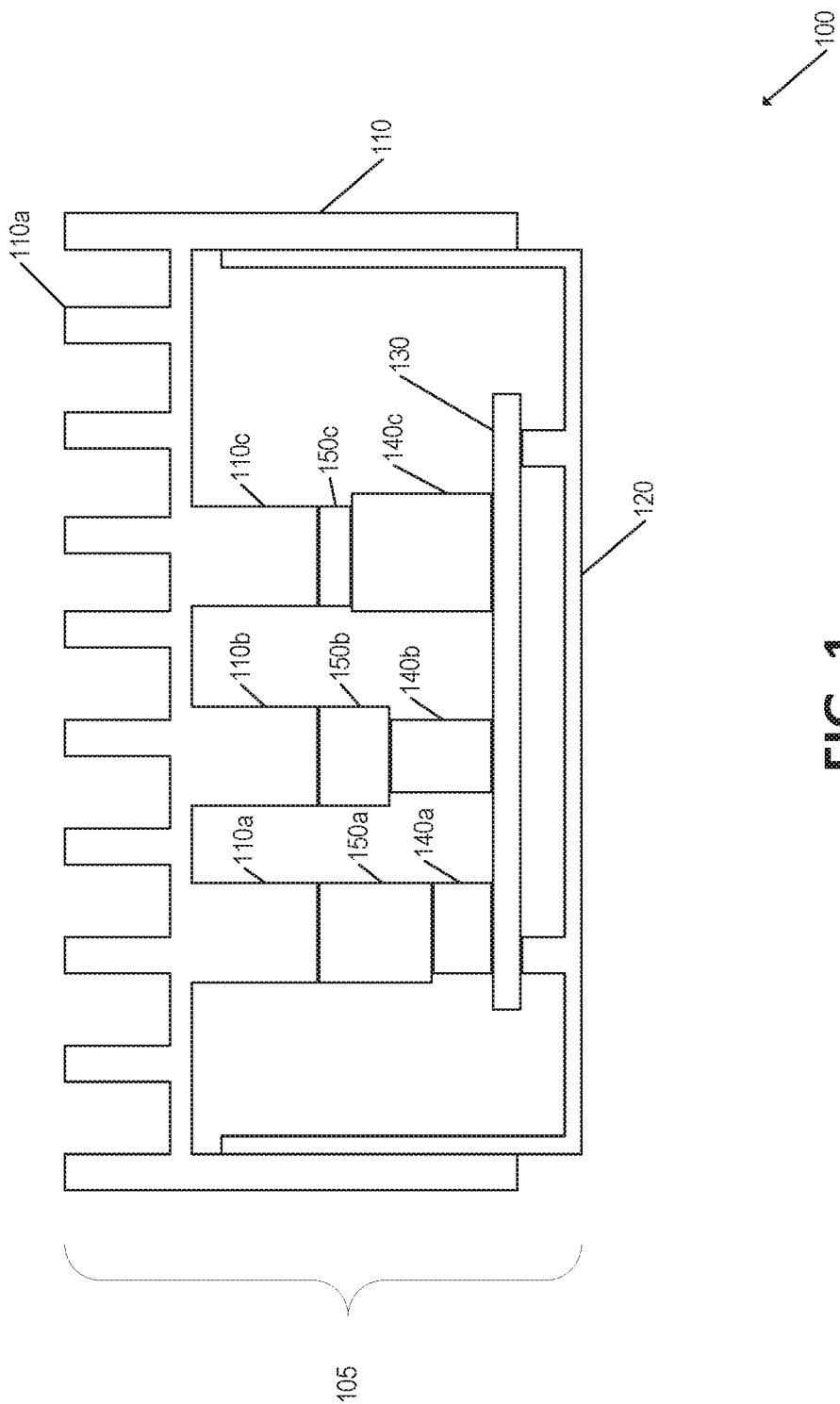
FIG. 1 is a block diagram illustrating an example system having static pedestals.

FIG. 1 is a block diagram illustrating an example system 100 having static pedestals 110a, 110b, and 110c, respectively. System 100 may include a chassis 120 forming a housing with heatsink 110. Specifically, heatsink 110 may form a part of the housing 105, and chassis 120 may form another part of the housing 105. In other words, heatsink 110 and chassis 120 may be assembled to form the housing 105. For example, the chassis 120 may act as a base of the housing 105, while the heatsink 110 may act as a lid of the housing 105.

Heatsink 110 may dissipate the heat generated by heat generating components 140a, 140b, and 140c. Heatsink 110 may be of a thermally conductive material such as aluminum or copper, and may include any number of fins, e.g. fin 110a, to dissipate heat to the outside environment. Although three example pedestals, 110a, 110b, and 110c, are depicted, heatsink 110 may have any number of pedestals.

Chassis 120 may at least partially house electrical components, such as a printed circuit board 130 having any number of electrical components mounted thereon. In this example, three electrical components of varying sizes are illustrated. However, any number of electrical components may be included on printed circuit board 130. Furthermore, the electrical components mounted on printed circuit board 130 may be of different sizes, or of uniform size.

The medium in which the electrical components are contained, e.g. air, may not be as thermally conductive as are pedestals 110a, 110b, and 110c. Thus, a greater air gap between an electrical component and a pedestal results in a less efficient heat transfer. In fact, eliminating any air gap between a heat generating component and a pedestal maximizes the heat transfer from the heat generating component to the pedestal. Thus, pedestals 110a, 110b, and 110c would ideally be placed in direct physical contact with heat generating components 140a, 140b, and 140c, with the exception of any electrically conductive thermal grease or thermal bonding applied to the heat generating component or the pedestal to increase the heat transfer between the heat generating component and the pedestal. However, having the pedestals 110a-c be in direct contact with the heat generating components 140a-c may require the heatsink 110 to be custom made for the particular printed circuit board 130, since the heat generating components 140 may be of varying height (both within a single printed circuit board 130 and also between different printed circuit boards).

Generally, it is impractical (e.g., too costly, too time consuming, etc.) to custom make heatsinks for a particular printed circuit board having particular heat generating components coupled thereon. Thus, it is generally not possible for there to be direct contact between static pedestals 110a, 110b, and 110c, and heat generating components 140a, 140b, and 140c. Accordingly, gap pads 150a, 150b, and 150c may be utilized to accommodate heat generating components of variable size and ensure thermal contact between pedestals 110a, 110b, and 110c and heat generating components 140a, 140b, and 140c.

Gap pads, e.g., 150a, 150b, and 150c, also known as thermal pads, thermally conductive pads, or thermal interface pads, are malleable thermal compounds that may be of variable sizes to interface between heat generating components such as 140*a*, 140*b*, and 140*c*, and heatsink pedestals such as 110*a*, 110*b*, and 110*c*. While gap pads may have a greater coefficient of thermal conductivity than air, they may be less thermally conductive than the heatsink pedestals themselves. Thus, the utilization of gaps pads 150*a*, 150*b*, and 150*c*, may ineffectively cool the heat generating components. This is especially true when a relatively thick gap pad, e.g. gap pad 150*a*, is utilized.

Figure 2B:
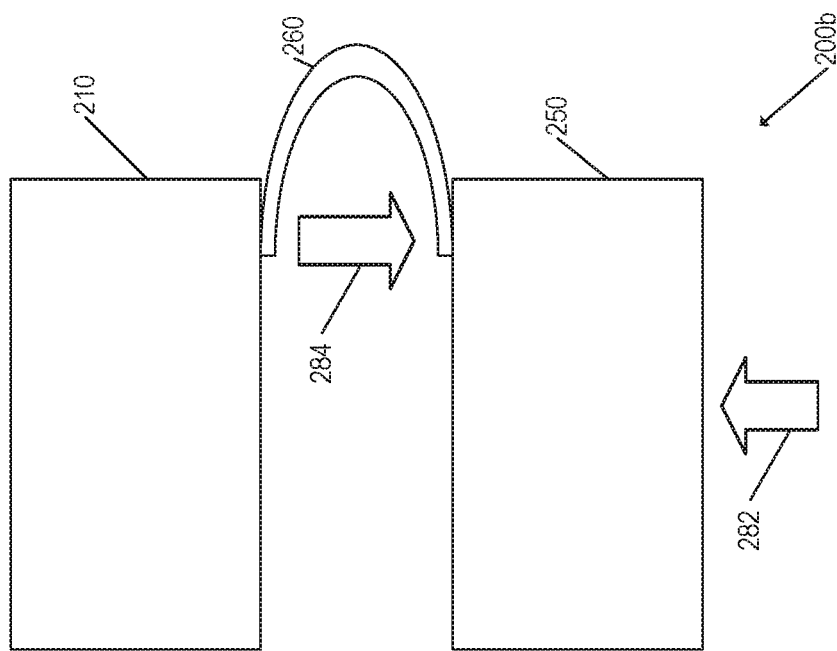
FIGS. 2a and 2b are block diagrams illustrating an example flexible heat transfer mechanism.
Figure 2A:
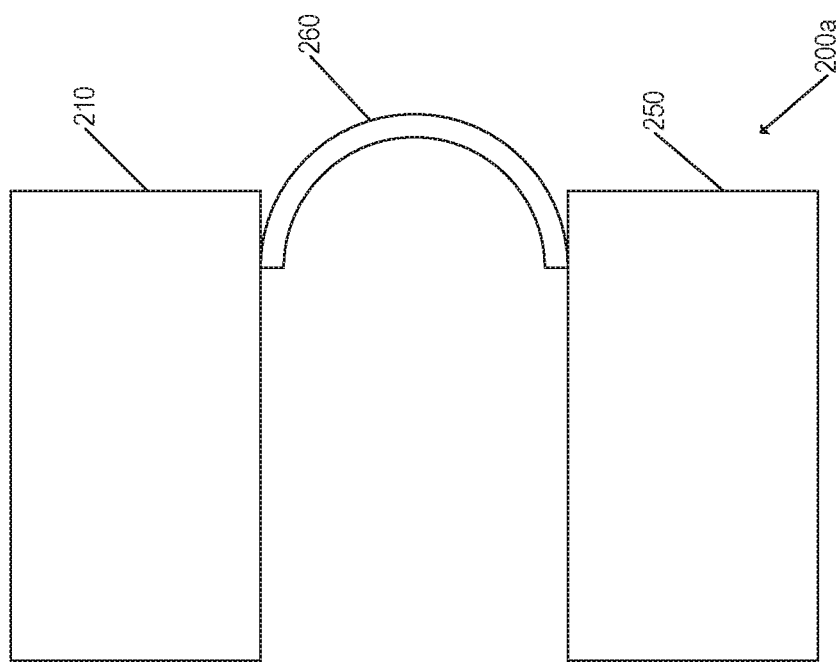

A flexible heat transfer mechanism having a vertically displaceable pedestal may be utilized in lieu of, or in addition to, a gap pad to transfer heat more effectively between the pedestal and a heat generating component, and to adjust to any movement of the heat generating component. FIGS. 2*a* and 2*b* are block diagrams illustrating example flexible heat transfer mechanisms 200*a* and 200*b*, including pedestal 250. Pedestal 250 may be fixed to a compliant heat transfer element 260 to transfer heat away from pedestal 250. Heat transfer element 260 may be a hollow structure, such as a heat pipe, and may be tubular in shape. Heat transfer element 260 may further be made of a compliant, yet sufficiently stiff material such as copper or aluminum.

In an example implementation, heat transfer element 260 may be connected to pedestal 250 at a first end, and may be attached at a center point of pedestal 250, or may be attached at an off-center point of pedestal 250 as is illustrated in FIGS. 2*a* and 2*b*. Heat transfer element 260 may further be connected to heatsink attachment 210 at a second end. In some example implementations, heatsink attachment 210 may be part of a heatsink, e.g. a pedestal of the heatsink, such that heat transfer element 260 is connected directly to the heatsink. In other example implementations, heatsink attachment 210 may be a static pedestal configured to connect to the heatsink. Pedestal 250 may be of a greater thermal conductivity than static pedestal 210. In some example implementations, heatsink attachment 210 may be a thermal bonding material, such as a thermally conductive glue, a thermally conductive tape, solder, or any other thermal bonding material or combination thereof for attaching heat transfer element 260 to the heatsink. A heatsink attachment may also include any mechanical attachment mechanism such as a bolt, a fastener, etc.

The configuration of heat transfer element 260, i.e. the composition and/or shape of heat transfer element 260, enables pedestal 250 to be flexible such that pedestal 250 may accommodate heat generating components of variable sizes. For example, heat transfer element 260 may be stretched or compressed to enable the positional displacement of pedestal 250 in a vertical direction 280.

In FIGS. 2*a* and 2*b*, heat transfer element 260 is configured in a C-shaped configuration. This configuration enables heat transfer element 260 to be sufficiently stiff, such that a compression of heat transfer element 260 in a first direction 282 results in a spring-like force from the heat transfer element directed in an opposite second direction 284. In an example implementation, force 284 may press pedestal 250 against a heat generating component (not shown), thus securing pedestal 250 to the heat generating component.

Although the heat transfer element illustrated in FIGS. 2*a* and 2*b* is configured in a C-shaped configuration, other configurations may be implemented, such as an S-shaped configuration, a helical configuration, etc. FIGS. 3*a* and 3*b* are block diagrams illustrating example flexible heat transfer mechanisms 300*a* and 300*b*, including pedestal 350 connected to heat transfer element 360 configured in an example S-shaped configuration. Like the heat transfer element configuration illustrated in FIGS. 2*a* and 2*b*, the configuration of heat transfer element 360, i.e. the composition and/or shape of heat transfer element 360, enables pedestal 350 to be flexible such that pedestal 350 may accommodate heat generating components of variable sizes. For example, heat transfer element 360 may be flexed to enable the positional displacement of pedestal 350 in a vertical direction 380 relative to heatsink 410.

Additionally, the S-shaped configuration enables heat transfer element 360 to be sufficiently stiff, such that a compression of heat transfer element 360 in a first direction 382 results in a spring-like force from the heat transfer element directed in an opposite second direction 384. In an example implementation, force may press pedestal 350 against a heat generating component (not shown), thus securing pedestal 350 to the heat generating component.

Figure 4:
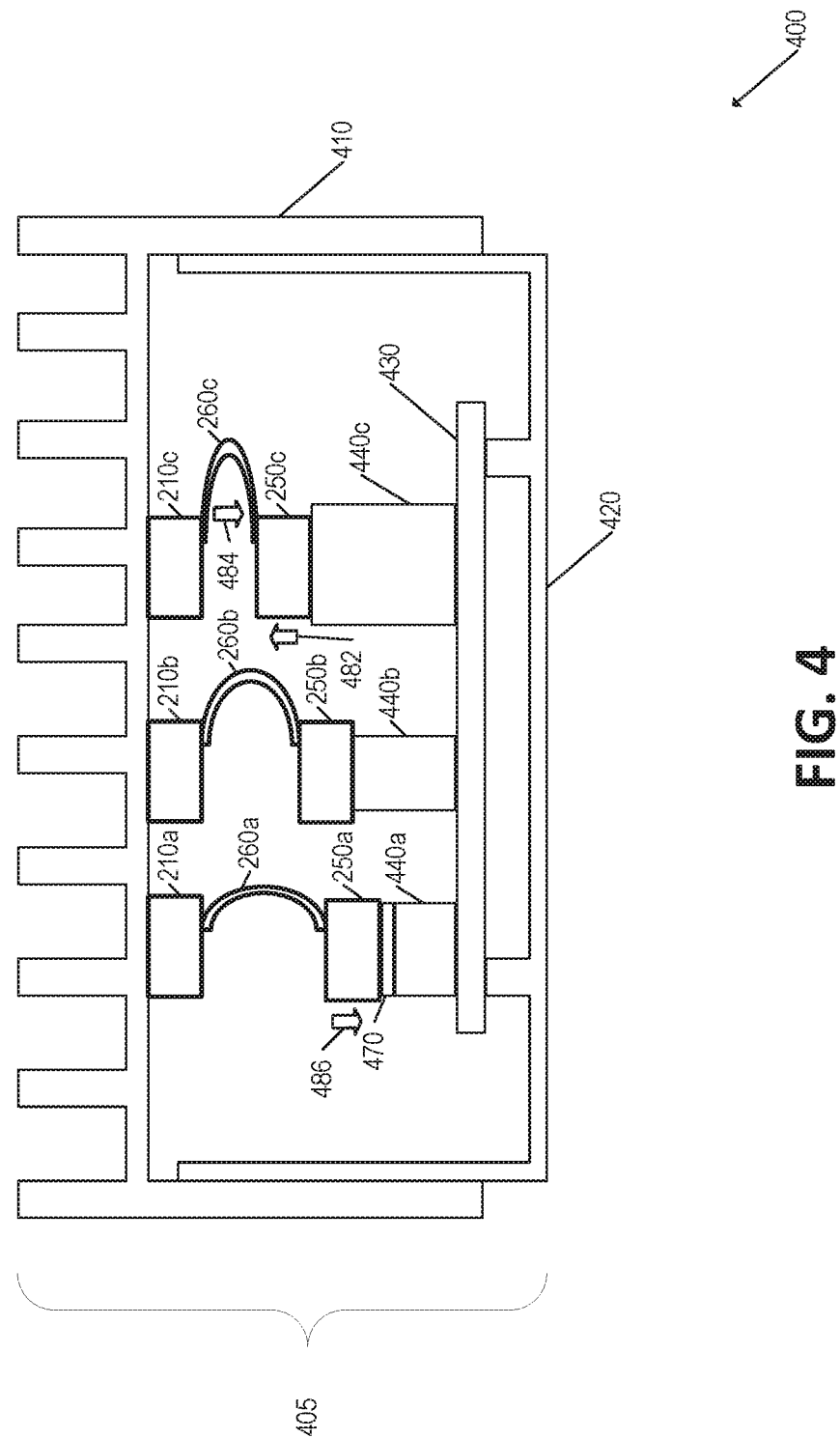
FIG. 4 is a block diagram illustrating another example system implementing a flexible heat transfer mechanism.

As described above, pedestals may be utilized to enable a vertical displacement of the pedestal such that the pedestal may sit directly on top of a heat generating component. Where gap pads are utilized, pedestals may be implemented to minimize the required thickness of the gap pads. FIG. 4 is a block diagram 400 illustrating an example system 400 that incorporates the flexible heat transfer mechanism illustrated in FIGS. 2*a* and 2*b*. System 400 includes a chassis 420 forming a housing 405 with heatsink 410. Specifically, heatsink 410 may form a part of the housing 405, and chassis 420 may form another part of the housing 405. In other words, heatsink 410 and chassis 420 may be assembled to form the housing 405. For example, the chassis 420 may act as a base of the housing 405, while the heatsink 410 may act as a lid of the housing 405.

The heat transfer mechanisms are housed within housing 405 and include pedestals, 250*a*, 250*b*, and 250*c* respectively, which may be displaced by flexing, i.e., stretching or compressing, heat transfer element 260*a*, 260*b*, or 260*c* in a vertical direction.

The flexible position of pedestals 250*a*, 250*b*, and 250*c* enable more efficient heat transfer between heat generating components 440*a*, 440*b*, and 440*c*, and each respective pedestal. For example, compliant heat transfer element 260 is illustrated as compressed such that pedestal 250*c* may sit on top of, and thus maintain direct contact with, heat generating component 440*c*. In an example implementation, compliant heat transfer element 260 may be compressed in a range between 0.5 millimeters-1.5 millimeters. In some example implementations, a thermal grease or thermal bonding may be layered between heat generating component 440*c* and pedestal 250*c*. In such an implementation, pedestal 250*c* may still be said to be in direct contact with heat generating component 440*c*.

In an example implementation, heat transfer element 260*c* may be sufficiently stiff such that a compression of heat transfer element 260*c* in a first direction 482 results in a spring-like force from the heat transfer element directed in an opposite second direction 484. In an example implementation, force 484 may press pedestal 250*c* against heat generating component 440*c*, thus securing pedestal 250*c* to heat generating component 440*c*. Any changes in heat generating component height during the manufacturing of, or due to movement or expansion of, heat generating component 440*c* may be accommodated with the flexibility of pedestal 250*c* due to the compression of compliant heat transfer element 260*c*.

As mentioned above, an electrically conductive thermal grease or thermal bonding may be layered between heat generating component 440*c* and pedestal 250*c*. In some example implementations, a gap pad 470 may be installed between a pedestal and a heat generating component. Due to the flexibility of the pedestal, a standard size or reduced thickness gap pad may be employed. For example, in FIG. 4, the weight of pedestal 250a may stretch compliant heat transfer element 260a in a downward direction 486 such that there is less distance between pedestal 250a and heat generating component 440a than there would be if a static pedestal was implemented. Thus, a thinner gap pad 470 may be installed between heat generating component 440a and pedestal 250a to account for the smaller air gap between heat generating component 440a and pedestal 250a.

Figure 5:
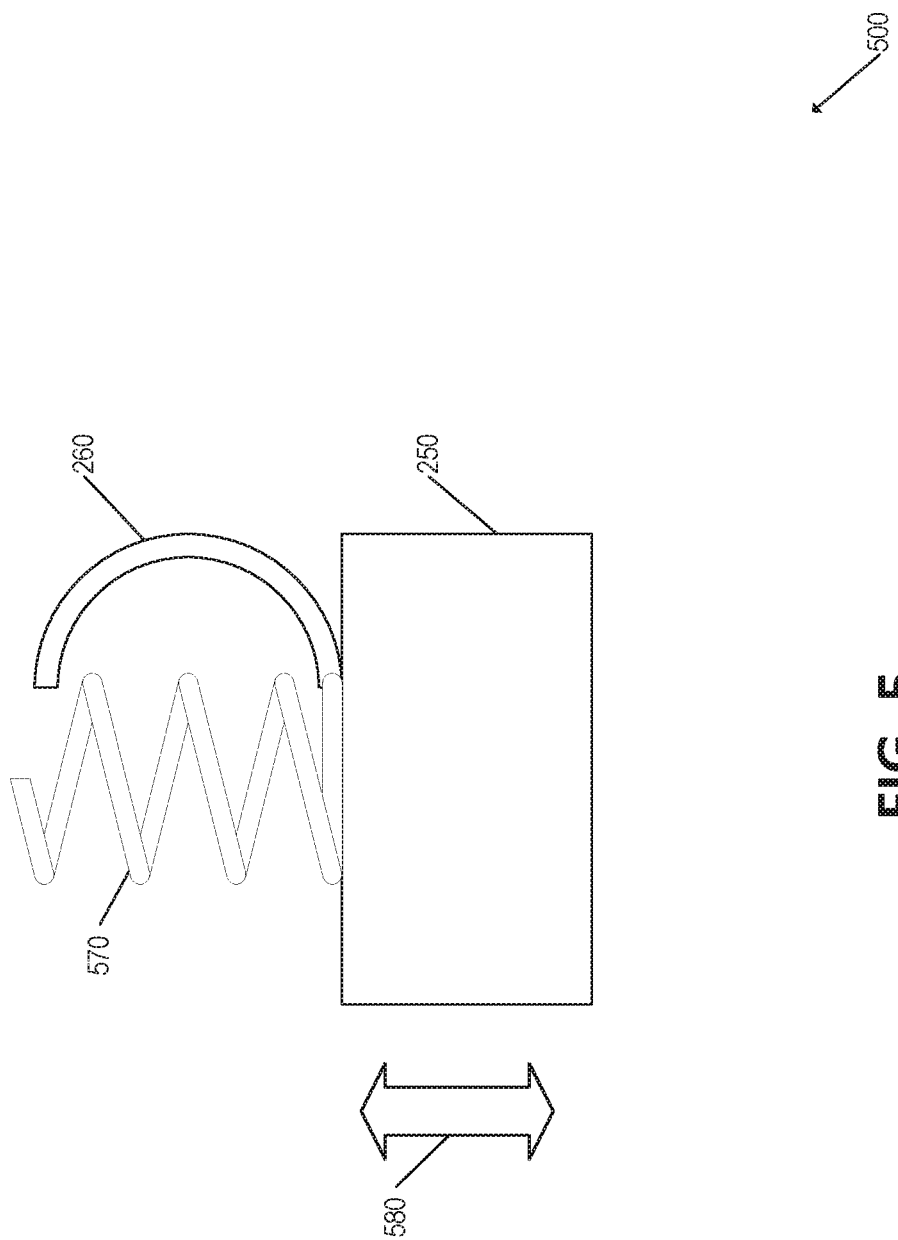
FIG. 5 is a block diagram illustrating yet another flexible heat transfer mechanism.

FIG. 5 is a block diagram illustrating another example flexible heat transfer mechanism 500. Heat transfer mechanism may share similar components to that of example heat transfer mechanism 200. For example, heat transfer mechanism 500 may include pedestal 250, as well as compliant heat transfer element 260 to transfer heat away from pedestal 250.

As described above, heat transfer element 260 may be stretched or compressed to enable the positional displacement of pedestal 250 in a vertical direction 580. In an example implementation, heat transfer element 260 may be sufficiently stiff such that a compression of heat transfer element 260 results in a spring-like force from the heat transfer element 260 in a direction opposite the direction of compression.

In some example implementations, the stiffness of heat transfer element 260 may be reinforced with a spring 570. Spring 570, like heat transfer element 260, may be fixed at a first end to pedestal 250. Spring 570 may be simultaneously compressed with heat transfer element 260 due to a vertical displacement of pedestal 250. Like heat transfer element 260, spring 570 may exert a force in response to compression in a direction opposite the compression. In an example implementation, spring 570 may be in contact with heat transfer element 260 to provide the heat transfer element 260 with sufficient rigidity and compliance. In the example illustrated in FIG. 5, spring 570 may be in direct contact with heat transfer element 260 at the first end of heat transfer element 260.

As illustrated in example heat transfer mechanism 500, heat transfer element 260 may be attached at an off-center point of pedestal 250, while spring 570 may attached at a center point of pedestal 250. However, heat transfer element 260 and spring 570 may be connected to pedestal 250 in any number of configurations. For example, heat transfer element 260 may be connected to the same central anchor point as spring 570. In other examples, both heat transfer element 260 and spring 570 are connected to pedestal 250 at off-center points. While a single compliant heat transfer element 260 and a single spring 570 are illustrated for purposes of explanation and conciseness, any number of heat transfer elements and springs may be connected to pedestal 250 for reinforcement and to enable the flexibility of pedestal 250.

Figure 6:
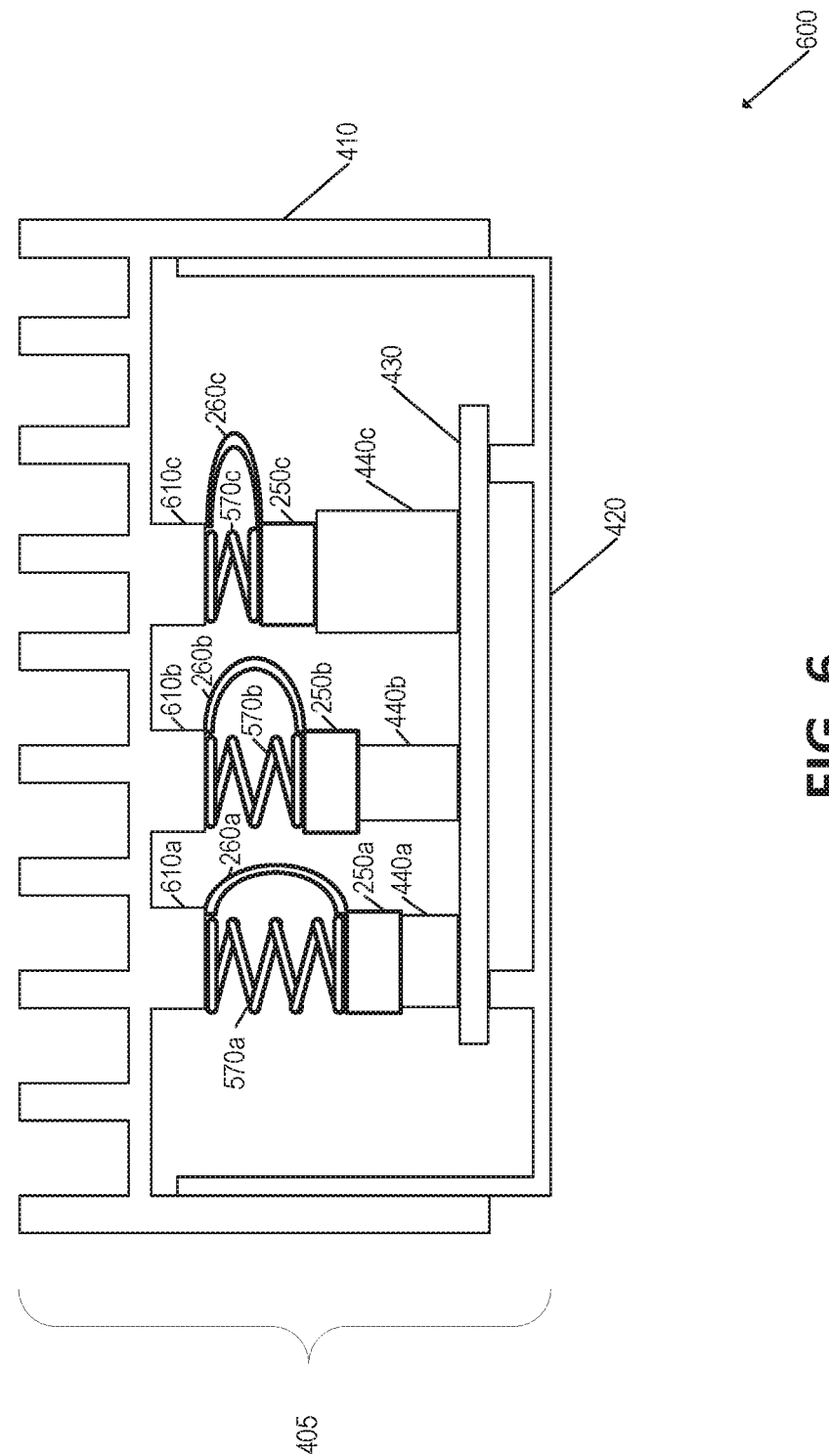
FIG. 6 is a block diagram illustrating another example system implementing a flexible heat transfer mechanism.

FIG. 6 is a block diagram illustrating another example system 600 having pedestals 250a, 250b, and 250c. System 600 of FIG. 6 may include similar architecture to that of block diagram 400 of FIG. 4. For example, system 600 may include chassis 420 forming part of housing 405 with heatsink 410, as well as printed circuit board 430 coupled to heat generating components 440a, 440b, and 440c.

FIG. 6 may incorporate the flexible heat transfer mechanism illustrated in FIG. 5. The incorporated heat transfer mechanisms include a pedestal, 250a, 250b, and 250c respectively, which may be displaced in a vertical direction relative to heatsink 410 by flexing, i.e., stretching or compressing, heat transfer element 260a, 260b, or 260c respectively, as well as springs 570a, 570b, and 570c respectively, in a vertical direction. The stiffness of heat transfer element 260a may be reinforced by spring 570a, the stiffness of heat transfer element 260b may be reinforced by spring 570b, and the stiffness of heat transfer element 260c may be reinforced by spring 570c. Springs 570a-570c may be simultaneously compressed with heat transfer element 260 due to a vertical displacement of pedestal 250 relative to heatsink. Like heat transfer element 260, spring 570 may exert a force in response to compression in a direction opposite the compression.

For example, the force exerted by spring 570c and heat transfer element 260c due to compression may press pedestal 250c against heat generating component 440c, thus securing pedestal 250c to heat generating component 440c. Any slight changes in heat generating component height due to movement of, or expansion of, heat generating component 440c may be accommodated with the flexibility of pedestal 250c due to the compression of heat transfer element 260c and spring 570c.

Figure 7:
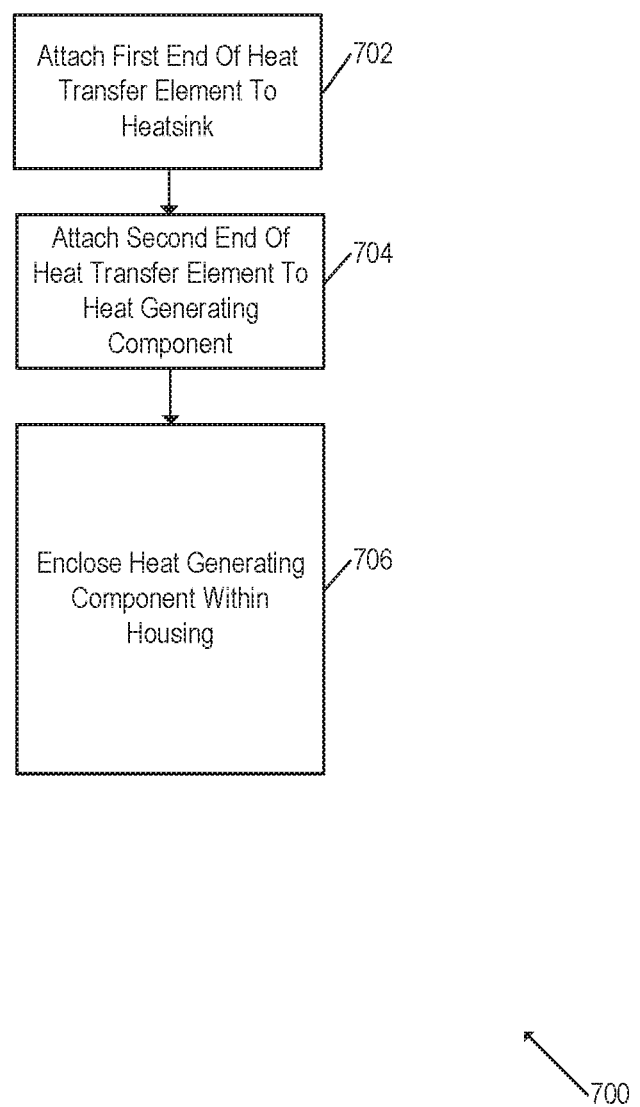
FIG. 7 is a flowchart illustrating an example method of coupling a heatsink housing to a heat generating component.

FIG. 7 is a flowchart illustrating an example method 700 of coupling a heatsink to a heat generating component. As described above, the coupling of a heatsink to a heat generating component enables the diffusion of heat from the heat generating component. To enable efficient heat transfer, a heatsink may be placed in close physical proximity to a heat generating component. However, such a configuration may be challenging due to the varying sizes of various heat generating components. A flexible heat transfer mechanism may interface between the heat generating component and the heatsink and may thus aid in the efficient transfer of heat between the heatsink and the heat generating component.

Although execution of method 700 is described below with reference to figures in the present Application, this is for explanatory purposes and other suitable components for execution of method 700 may be utilized. In some examples, steps of method 700 may be executed substantially concurrently or in a different order than shown in FIG. 7. In some examples, method 700 may include more or less steps than are shown in FIG. 7. In some examples, some of the steps of method 700 may, at certain times, be ongoing and/or may repeat.

At block 702, a first end of a heat transfer element may be attached to a heatsink. For example, the flexible heat transfer mechanism including the heat transfer element 260 described in FIG. 2a may be attached to a heatsink, e.g. heatsink 410 of FIG. 4 or FIG. 6. The first end of the heat transfer element may be attached, e.g. bolted, soldered, etc., directly to the heatsink. For example, the first ends of heat transfer elements 260a, 260b, and 260c are attached directly to heatsink 410 of FIG. 6 via attachment points 610a, 610b, and 610c respectively, of heatsink 410.

In another example, the first end of the heat transfer element may be attached indirectly to the heatsink. For example, the first ends of heat transfer elements 260a, 260b, and 260c are attached indirectly to heatsink 410 of FIG. 4 via heatsink attachments 210a, 210b, and 210c respectively. Heatsink attachments 210a, 210b, 210c may be static pedestals configured to connect to the heatsink, or may otherwise be any component for attaching heat transfer elements 260a, 260b, and 260c to the heatsink.

At block 704, a second end of the heat transfer element may be attached to a heat generating component. The second end of the heat transfer element may be attached directly to heat generating component, or indirectly e.g. via a pedestal.

At block 706, the first heat generating component may be enclosed within at least part of the heatsink housing by compressing the heat transfer element between the heat generating component and the heatsink such that the heat transfer element flexes responsive to a movement or change in size of the first heat generating component. In another example implementation, the first heat generating component may be enclosed within at least part of the heatsink housing by vertically displacing a pedestal attached to the second end of the heat transfer element, thus compressing the heat transfer element. The pedestal may then be secured on top of the first heat generating component.

Turning to the example presented in FIG. 4, pedestal 250c is shown as vertically displaced in a first direction 482 relative to the heatsink. This vertical displacement compresses heat transfer element 260c, which causes heat transfer element 260c to exert a force in a second direction 484 opposite first direction 482. This force may press pedestal 250c against heat generating component 440c, thus securing pedestal 250c on top of heat generating component 440c. The force applied by compressing heat transfer element 260c ensures a secure fit of pedestal 250c on top of heat generating component 440c while simultaneously accounting for any positional changes of state by heat generating component 440c. For example, heat transfer element 260c may be a compliant member such that heat transfer element 260c may further compress or decompress in response to any changes in heat generating component height due to movement of, or expansion of, heat generating component 440c.

Figure 8:
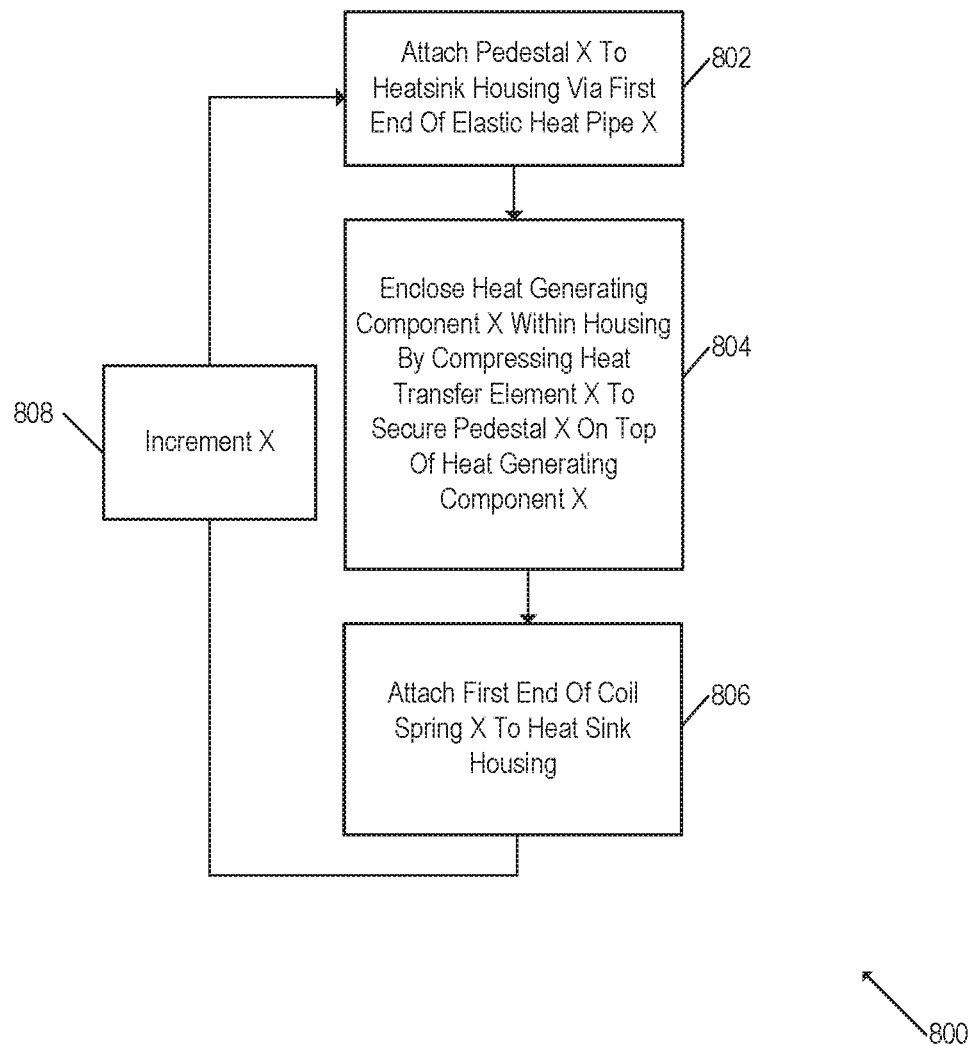
FIG. 8 is a flowchart illustrating another example method of coupling a heatsink housing to a heat generating component.

FIG. 8 is a flowchart illustrating another example method 800 of coupling a heatsink to a heat generating component. Although execution of method 800 is described below with reference to figures in the present Application, this is for explanatory purposes and other suitable components for execution of method 800 may be utilized. In some examples, steps of method 800 may be executed substantially concurrently or in a different order than shown in FIG. 8. In some examples, method 800 may include more or less steps than are shown in FIG. 8. In some examples, some of the steps of method 700 may, at certain times, be ongoing and/or may repeat.

At block 802, a pedestal may be attached to a heatsink via a first end of a heat transfer element. For example, the flexible heat transfer mechanism described in FIG. 2a may be attached to a heatsink, e.g. heatsink 410 of FIG. 4 or FIG. 6.

At block 804, a heat generating component may be enclosed within at least part of the heatsink by compressing the heat transfer element to place the pedestal on top of the heat generating component. Specifically, the pedestal may be secured on top of the heat generating component by vertically displacing the pedestal, thus compressing the heat transfer element.

At block 806, a spring, e.g. a coil spring, may be attached to the heatsink. Specifically, a first end of the spring may be attached to the heatsink, while the spring is coupled to the pedestal at a second end. The spring may be compressed when the pedestal is vertically displaced relative to the heatsink such that the spring presses the pedestal against the heat generating component.

Any number of heat transfer mechanisms may be implemented to interface between any number of heat generating components and the heatsink. Thus, at block 808, X may be incremented and the process of method 800 may be repeated until each heat generating component is enclosed within at least part of the housing. For instance, a first heat generating component of a first height may be enclosed within the housing of the heatsink via the method described above, and a second heat generating component of a second height different from the first height may be enclosed within the housing of the heatsink via the method described above. Thus, different pedestals may be secured on top of different sized heat generating components within a housing for efficient heat transfer.

As used herein, an object, such as the heat transfer element described above, is considered "thermally conductive" if the material forming the object is "thermally conductive". Thermal conductivity (often denoted k, λ, or κ) is the property of a material to conduct heat. Examples of materials that are thermally conductive include almost all metals and their alloys (e.g., copper, aluminum, gold, etc.), some plastics (e.g., TECACOMP® TC compounds, Cool-Poly® D-series Thermally Conductive Plastics), and many other materials. A heat pipe or vapor chamber may be examples of a thermally conductive object.

Heat pipes are heat transfer devices comprising hollow, elongated vessels whose interior volume contains a working fluid (e.g., water, methanol, etc.) that is used to transfer heat from a hot side of the device to a cooler side of the device via a repeating cycle of vaporization, condensation, mass transfer, and conduction. In particular, the working fluid absorbs heat at the hot side and thus is vaporized. The vapor flows to the cooler side via mass transfer, vaporization, and/or condensation. The vapor contacts a wall at the cooler side and condenses (thus releasing its heat into the wall), and the liquid flows back to the hot side via a wicking mechanism to start the cycle again. This cycle enables a heat pipe to transfer heat at rates that greatly exceed those possible solely from conduction in a solid piece of metal of similar size and shape (even highly conductive metals such as copper). A vapor chamber may operate on similar principles as a heat pipe.

While the above disclosure has been shown and described with reference to the foregoing examples, it should be understood that other forms, details, and implementations may be made without departing from the spirit and scope of this disclosure.

The invention claimed is:

1. A system comprising:
    a heatsink component that dissipates heat from a heat generating component;
    a heat transfer element having a first end and a second end, the heat transfer element connected to the heatsink component at the first end of the heat transfer element;
    a pedestal connected to the heat transfer element at the second end of the heat transfer element; and
    a spring coupled to the heatsink component at a first end of the spring, coupled to the pedestal at a second end of the spring, and in contact with the heat transfer element to reinforce stiffness of the heat transfer element;
    wherein the heat transfer element comprises a compliant member to flex and exert an opposing spring-like force in a vertical direction, and
    wherein the heat transfer element thermally links the heatsink component and the heat generating component to directly transfer heat between the pedestal and the heatsink component.

2. The system of claim 1, wherein the heat generating component is coupled to a printed circuit board, and the heatsink component forms at least part of a housing for the printed circuit board.

3. The system of claim 1, wherein the heat transfer element further comprises a hollow structure.

4. The system of claim 1, wherein the compliant member of the heat transfer element is sufficiently stiff such that the heat transfer element, upon compression, presses the pedestal against the heat generating component.

5. The system of claim 1, wherein the heat transfer element is positioned between the heatsink component and the pedestal and the second end of the heat transfer element is coupled to the pedestal at an off-center point.

6. The system of claim 1, wherein the heat transfer element further comprises a C-shaped configuration.

7. The system of claim 1, wherein the pedestal is a first pedestal of a plurality of pedestals coupled to the heatsink component via a plurality of heat transfer elements including the heat transfer element, wherein the first pedestal of the plurality of pedestals is in contact with the heat generating component, the heat generating component being of a first height, and a second pedestal of the plurality of pedestals is in contact with a different heat generating component of a second height different than the first height.

8. The system of claim 1, wherein the spring flexes in the vertical direction.

9. The system of claim 1, wherein the pedestal has greater thermal conductivity than the heatsink component.

10. A method of coupling a heatsink that forms at least a part of a housing of an electronic device to a first heat generating component within the housing, the method comprising:
    attaching a first end of a first heat transfer element to the heatsink,
    attaching a second end of the first heat transfer element to the first heat generating component via a first pedestal;
    enclosing the first heat generating component within the housing, including compressing the first heat transfer element between the first heat generating component and the heatsink such that the first heat transfer element flexes responsive to a movement or change in size of the first heat generating component, and such that the first heat transfer element thermally links the heatsink and the first heat generating component to directly transfer heat between the first pedestal and the heatsink; and
    attaching a first end of a spring to the heatsink and the first pedestal to a second end of the spring,
    wherein the spring is in contact with the heat transfer element,
    wherein the first heat transfer element responds to a vertical force with compliance and an opposing spring-like force, and
    wherein the spring reinforces a stiffness of the first heat transfer element.

11. The method of claim 10, wherein the spring flexes responsive to the movement or change in size of the first heat generating component.

12. The method of claim 10, wherein the second end of the first heat transfer element is attached to the first pedestal and is attached to the first heat generating component by compressing the first pedestal against the first heat generating component.

13. The method of claim 12, further comprising:
    attaching a plurality of pedestals including the first pedestal to the heatsink via a plurality of heat transfer elements including the first heat transfer element,
    wherein enclosing the first heat generating component within at least part of the housing includes enclosing a printed circuit board including the first heat generating component and a second heat generating component within the housing by vertically displacing the first pedestal of the plurality of pedestals to secure the first pedestal on top of the first heat generating component and vertically displacing a second pedestal of the plurality of pedestals to secure the second pedestal on top of the second heat generating component, wherein the first heat generating component and the second heat generating component are of different heights.

\* \* \* \* \*